(12) United States Patent
Hsu et al.

(10) Patent No.: US 8,492,787 B2
(45) Date of Patent: Jul. 23, 2013

(54) LIGHT-EMITTING DEVICE

(75) Inventors: Ta-Cheng Hsu, Hsinchu (TW);
Meng-Lun Tsai, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 417 days.

(21) Appl. No.: 12/486,217

(22) Filed: Jun. 17, 2009

(65) Prior Publication Data

US 2009/0309123 A1 Dec. 17, 2009

(30) Foreign Application Priority Data

Jun. 17, 2008 (TW) .............................. 97122631 A

(51) Int. Cl.
*H01L 33/06* (2010.01)
*H01L 33/00* (2010.01)

(52) U.S. Cl.
USPC .................. 257/99; 257/79; 257/94; 257/14; 257/103; 257/E33.023; 257/E33.001; 257/E33.008; 257/13; 257/E33.005

(58) Field of Classification Search
USPC .................... 257/99, 103, E33.023, E33.055, 257/79, 94, 14, 13, E33.001, E33.008, E33.005
See application file for complete search history.

(56) References Cited

U.S. PATENT DOCUMENTS 6,555,403 B1 * 4/2003 Domen et al. ................. 438/22

FOREIGN PATENT DOCUMENTS

| CN | 1619852 | 10/2004 |
|---|---|---|
| TW | 200414563 | 1/2003 |
| TW | 200414563 | * 8/2004 |

* cited by examiner

*Primary Examiner* — Matthew Reames
*Assistant Examiner* — Benjamin Tzu-Hung Liu
(74) *Attorney, Agent, or Firm* — Muncy, Geissler, Olds & Lowe, PLLC

(57) ABSTRACT

This application discloses alight-emitting diode device, comprising an epitaxial structure having a light-emitting layer, a first-type conductivity layer, and a second-type conductivity layer wherein the thicknesses of the first-type conductivity confining layer is not equal to the second-type conductivity confining layer and the light-emitting layer is not overlapped with the portion of the epitaxial structure corresponding to the peak zone of the wave intensity distribution curve along the direction of the epitaxy growth.

15 Claims, 5 Drawing Sheets

US 8,492,787 B2

LIGHT-EMITTING DEVICE

BACKGROUND

1. Technical Field

This application discloses a light-emitting diode device, comprising a light-emitting layer not overlapped with the peak zone of the wave intensity distribution curve along the direction of the epitaxy growth.

2. Reference to Related Application

This application claims the right of priority based on TW application Ser. No. 097122631, filed Jun. 17, 2008, entitled "LIGHT-EMITTING DEVICE", and the contents of which are incorporated herein by reference.

3. Description of the Related Art

The luminescence principle of the light-emitting diode (LED) devices is to generate light by the energy difference of the electron moving in the n-type semiconductor and the p-type semiconductor, which is different from that of the incandescent light, and it is the reason for the light-emitting diode device to be called as cold light sources. Besides, the LED devices have the characteristics of high durability, long operation life, small volume and low power consumption and so on so the LED is attractive in lighting market and is viewed as the new generation lighting device.

FIG. 1 shows a conventional light-emitting diode device 100 including a substrate 10, an epitaxial structure 12 formed on the substrate 10, and a least an electrode 14 formed on the epitaxial structure 12. The epitaxial structure 12 includes a first type semiconductor layer 120, a light-emitting layer 122, and a second type semiconductor layer 124 formed subsequently. Usually, the structure of the light-emitting layer 122 is a multi-quantum well structure.

FIG. 1B is schematic illustration of the bandgap distribution of the conventional light-emitting diode device 100. As shown in FIG. 1B, the structure of the light-emitting layer 122 of the light-emitting diode device 100 includes a plurality of quantum barrier layers 130 and a plurality of quantum well layers 132 inserted between the quantum barrier layers 130 wherein the bandgap of the material of the quantum well layers 132 is usually smaller than that of the quantum barrier layers 130. The quantum well layers 132 not only extracts light, but also absorbs the light that having the wavelength the same with or shorter than the light extracted form the quantum well layers 132 when the light passes the quantum well layers 132. The light absorption effect of the quantum well layers 132 described above exists in the light-emitting element of GaN or AlGaInP material system, especially in AlGaInP material system.

In addition, in order to increase the external efficiency of the light-emitting diode device 100, the quantum barrier layers 130 and quantum well layers 132 are repeatedly stacked in stagger with 20 to 100 layers, and the effect of the light extracted from the light-emitting layer 124 to be absorbed by the quantum well layers 132 is therefore aggravated as the quantity of the stacked layers and the thickness of the quantum well layers 132 increased.

FIG. 1C illustrates the intensity distribution curve of the conventional epitaxial stack structure 12 of the light-emitting diode device. As shown in FIG. 1C, the conventional light-emitting diode device 100 has a intensity distribution curve B along the epitaxy growth direction A, and has a peak zone in the intensity distribution curve B. The peak zone means a zone that has the intensity value higher than 90% of the max intensity value in the intensity distribution curve B (the zone formed by the dotted line B1, B2 and the intensity distribution curve B), wherein the peak zone is overlapped with the light-emitting layer 122. Besides, by calculating the percentage of the zone of the intensity distribution curve B overlapped with the light-emitting layer 122 (the slash zone) to the zone of the total intensity distribution curve B the optical confinement factor $\tau_{active\ layer}$ of the light-emitting layer 122 can come out. As shown in FIG. 1C, the conventional $\tau_{active\ layer}$ is about 60%. As described above, because most light extracted from the light-emitting layer is confined in the area of the light-emitting layer, and the material of the light-emitting layer is easy to absorb light makes it hard to raise the light efficiency of the light-emitting diode device 100.

SUMMARY

In order to resolve the mentioned issue, a light-emitting diode device structure of this application is presented to reduce the opportunity of the light to be absorbed by the light-emitting layer and raise the light extraction efficiency.

This application discloses a light-emitting diode device having a light-emitting layer not overlapped with the peak zone of the wave intensity distribution curve along the direction of the epitaxy growth.

This application discloses a light-emitting diode device whose intensity distribution curve along the epitaxy growth direction having a peak zone corresponding to a layer or layers other than the light-emitting layer in the light emitting diode device to reduce the light absorption effect by the material of the light-emitting layer and raise the light extraction efficiency.

The application also discloses a light-emitting diode device with its optical confinement factor $\tau_{active\ layer}$ of the light-emitting layer less than 60%.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1A:
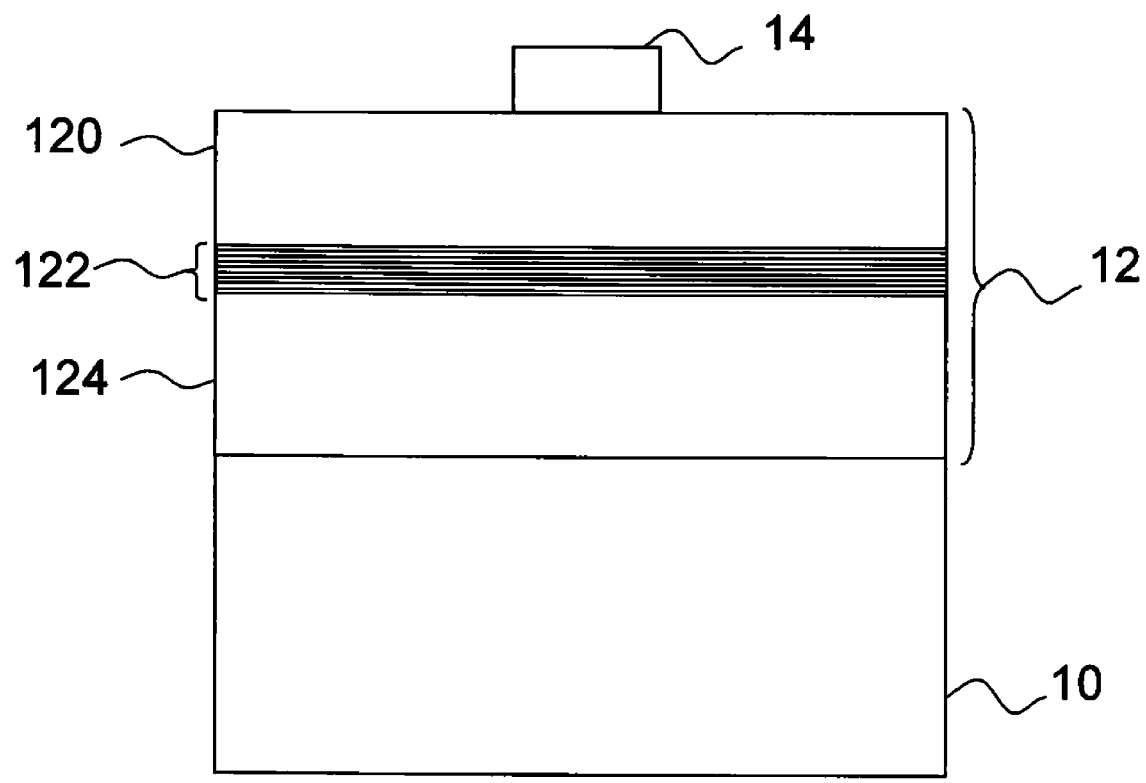
FIG. 1A is a schematic illustration of the structure of the conventional light-emitting diode device.
Figure 1B:
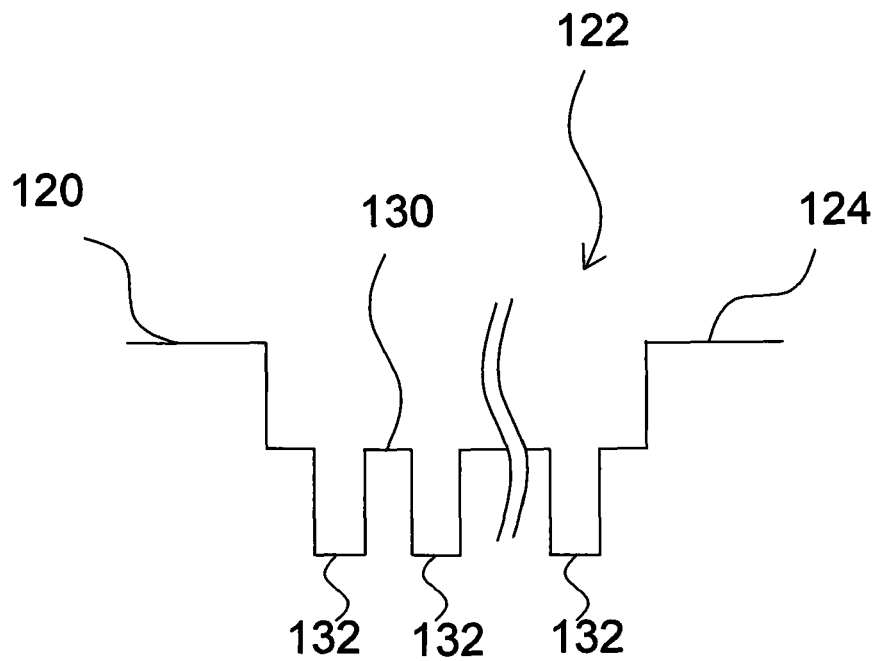
FIG. 1B is schematic illustration of the bandgap distribution of the conventional light-emitting diode device.
Figure 1C:
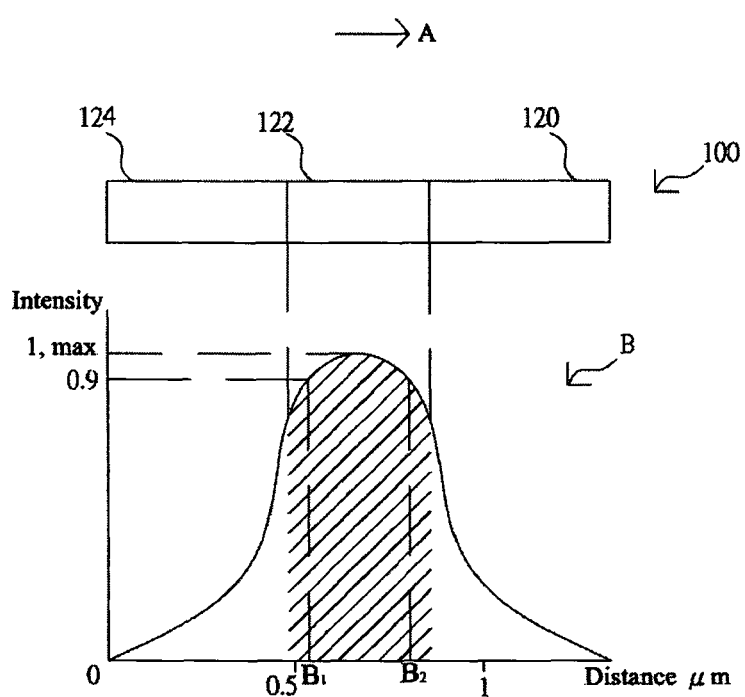
FIG. 1C illustrates the intensity distribution curve along the epitaxy growth direction of the conventional light-emitting diode device.

Reference is made in detail to the preferred embodiments of the present application, examples of which are illustrated in the accompanying drawings. Wherever possible, the same reference numbers are used in the drawings and the description to refer to the same or like parts.

Figure 2:
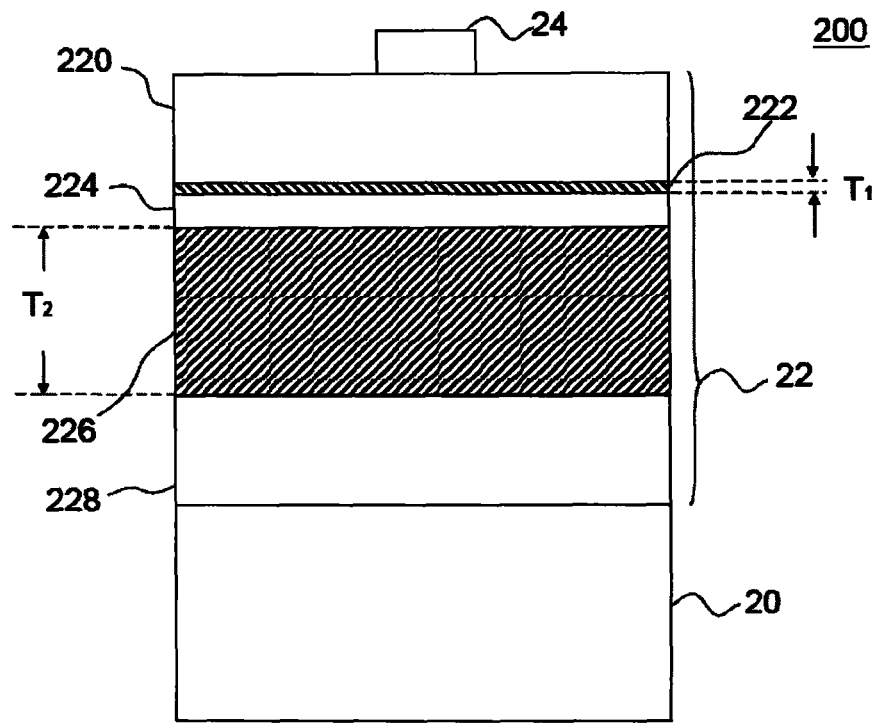
FIG. 2 is a schematic illustration of the structure of the light-emitting diode device in accordance with one embodiment of the present application.

FIG. 2 is a schematic illustration of the structure in accordance with the first embodiment of the present application. As shown in FIG. 2, the light-emitting diode device 200 of this embodiment includes a substrate 20, an epitaxial structure 22 formed on the substrate 20 wherein the epitaxial structure includes a first-type conductivity cladding layer 220, a first-type conductivity confining layer 222, a light-emitting layer 224, a second-type conductivity confining layer 226, and a second-type conductivity cladding layer 228 epitaxially grown from the bottom to the top. Besides, a least an electrode is formed on the epitaxial structure 22 wherein the thickness of the first-type conductivity confining layer 222 T1 is not equal to the thickness of the second-type conductivity confining layer 226 T2. The thickness ratio T1/T2 of the first-type conductivity confining layer 222 T1 and the second-type conductivity confining layer 226 T2 is ½~¹/₂₀₀ or 2-200. In a preferred embodiment, the thickness ratio T1/T2 of the first-type conductivity confining layer 222 T1 and the second-type conductivity confining layer 226 T2 is smaller than ¹/₁₀₀ or larger than 100.

Figure 3:
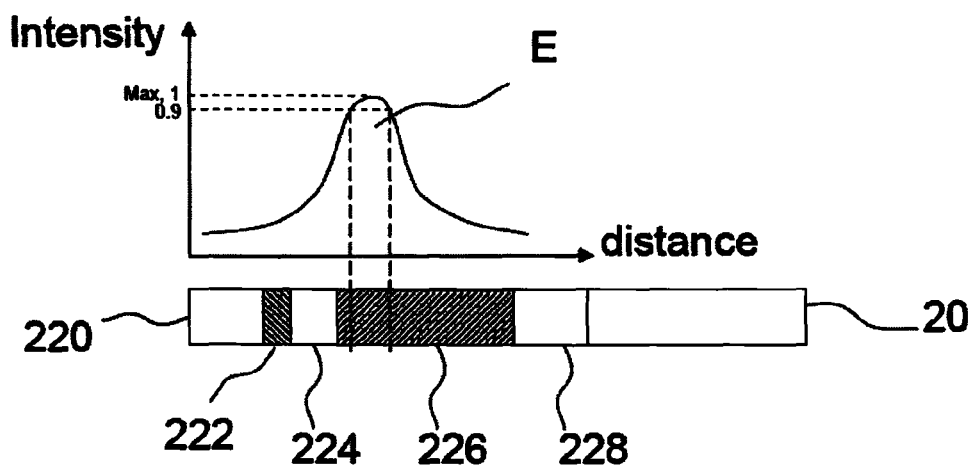
FIG. 3 illustrates the intensity distribution curve along the epitaxy growth direction in accordance with the embodiment of the present application.

Besides, the light-emitting layer 224 has a first refractive index $n_1$, the first-type conductivity confining layer 222 and the second-type conductivity confining layer 226 have a second refractive index $n_2$, the first-type conductivity cladding layer 220 and the second-type conductivity cladding layer 228 have a third refractive index $n_3$, wherein the first refractive index is larger than the second refractive index, and the second refractive index is larger than the third refractive index ($n_1 > n_2 > n_3$). Because in the epitaxial structure 22, the refractive index $n_2$ of the first-type conductivity confining layer 222 and the second-type conductivity confining layer 226 is between the refractive index $n_1$ of the light-emitting layer and the refractive index $n_3$ of first-type conductivity cladding layer 220 and the second-type conductivity cladding layer 228, the light is more likely to be confined in the first-type conductivity confining layer 222 and the second-type conductivity confining layer 226 than in the first-type conductivity cladding layer 220 and the second-type conductivity cladding layer 228. Furthermore, because of the thickness difference between the first-type conductivity confining layer 222 and the second-type conductivity confining layer 226 as illustrated in FIG. 3, the epitaxial structure 22 in the light emitting device 200 has an intensity distribution curve along the epitaxy growth direction. The intensity distribution curve has a peak zone E that corresponds to the layers other than the light-emitting layer 224 of the epitaxial structure 22. wherein the peak zone E means the zone having the intensity value higher than 90% of the max intensity value in the intensity distribution curve.

Figure 4:
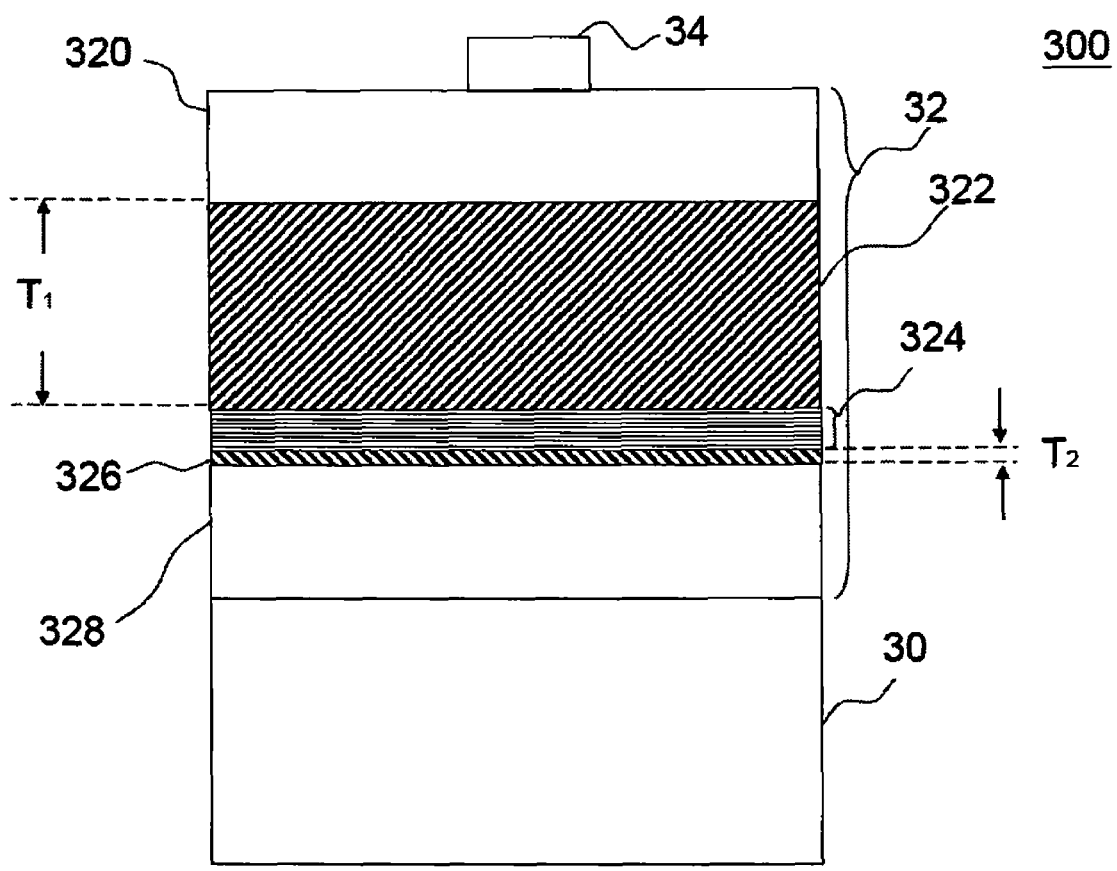
FIG. 4 is a schematic illustration of the structure of the light-emitting diode device in accordance with another embodiment of the present application.

FIG. 4 is a schematic illustration of the structure in accordance with the second embodiment of the present application. As shown in FIG. 4, the light-emitting diode device 300 of this application includes a substrate 30, an epitaxial structure 32 formed on the substrate 30 and a least an electrode 34 formed on the epitaxial structure 32. The epitaxial structure a least includes a first-type conductivity cladding layer 320, a first-type conductivity confining layer 322, a light-emitting layer 324, a second-type conductivity confining layer 326, and a second-type conductivity cladding layer 328 epitaxially grown from the bottom to the top. The material of the substrate is chosen form the material having the characteristic of high thermal conduction, high transparency, high reflection, or high electrical conduction. Besides, in this embodiment, the thickness of the first-type conductivity confining layer 322 T1 is about 500 nm, and the thickness of the second-type conductivity confining layer 326 T2 is about 5 nm. The thickness ratio T1/T2 of the first-type conductivity confining layer 322 T1 and the second-type conductivity confining layer 326 T2 is about 100. The structure of the light-emitting layer 324 is AlGaInP multi-quantum well and includes a plurality of AlGaInP quantum barrier layers (not shown) and a plurality of AlGaInP quantum well layers (not shown) inserted between the quantum barrier layers. Because the quantum barrier layers and the quantum well layers have different refractive index respectively, the multi-quantum well structure can get an equivalent first refractive index $\overline{n}_1$ according to its composition ratio. The first-type conductivity confining layer 322 and the second-type conductivity confining layer 326 have a second refractive index $n_2$, the first-type conductivity cladding layer 320 and the second-type conductivity cladding layer 328 have a third refractive index $n_3$, wherein the first refractive index is larger than the second refractive index, and the second refractive index is larger than the third refractive index ($\overline{n}_1 > n_2 > n_3$).

Figure 5:
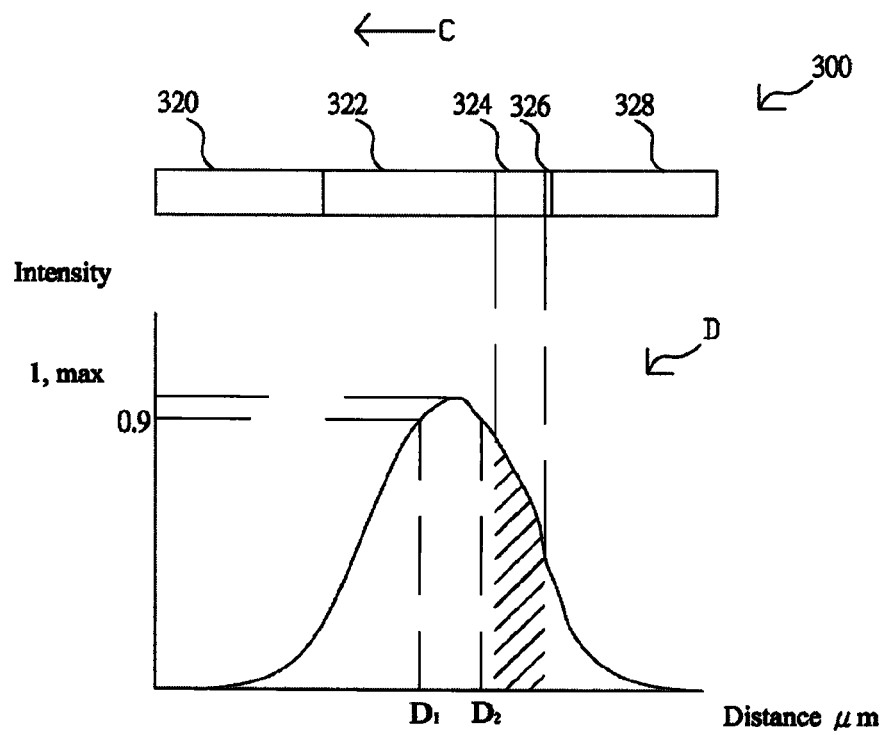
FIG. 5 illustrates the intensity distribution curve along the epitaxy growth direction in accordance with the embodiment of the present application.

FIG. 5 illustrates the intensity distribution curve along the epitaxy growth direction in accordance with the embodiment of the present application. As illustrated in FIG. 5, the light-emitting diode device 300 has an intensity distribution curve D along the epitaxy growth direction C. Because of the difference of the refractive index in difference material of the layers, and the thickness difference between the first-type conductivity confining layer 322 and the second-type conductivity confining layer 326, the light-emitting layer 324 is not overlapped with the portion of the epitaxial structure corresponding to the peak zone D of the wave intensity distribution curve along the direction of the epitaxy growth. (the zone formed by the dotted line D1, D2 and the intensity distribution curve D) wherein the peak zone means the zone that the intensity value is higher than 90% of the max intensity value in the intensity distribution curve. Besides, by calculating the percentage of the zone of the intensity distribution curve overlapped with the light-emitting layer 324 (the slash zone) to the zone of the total intensity distribution curve, the optical confinement factor $\tau_{active\ layer}$ of the light-emitting layer 324 can come out. In this embodiment, the $\tau_{active\ layer}$ of the light-emitting layer 324 is smaller than 60%; in a preferred embodiment, the $\tau_{active\ layer}$ of the light-emitting layer 324 is not larger than 30%.

In the process of the light emitting form the light-emitting layer 324 to extraction from the light emitting device 300, the light will be confined in the structure corresponding to the peck zone. In this application, the $\tau_{active\ layer}$ of the light-emitting layer 324 is smaller than 60%, and the position of the light-emitting layer 324 is not overlapped with the peak zone of the wave intensity distribution curve along the direction of the epitaxy growth of the epitaxial structure 32. So the light extraction efficiency can be raised by decreasing the opportunities of lights extracted by the light-emitting layer to be absorbed by the self structure.

Figure 6:
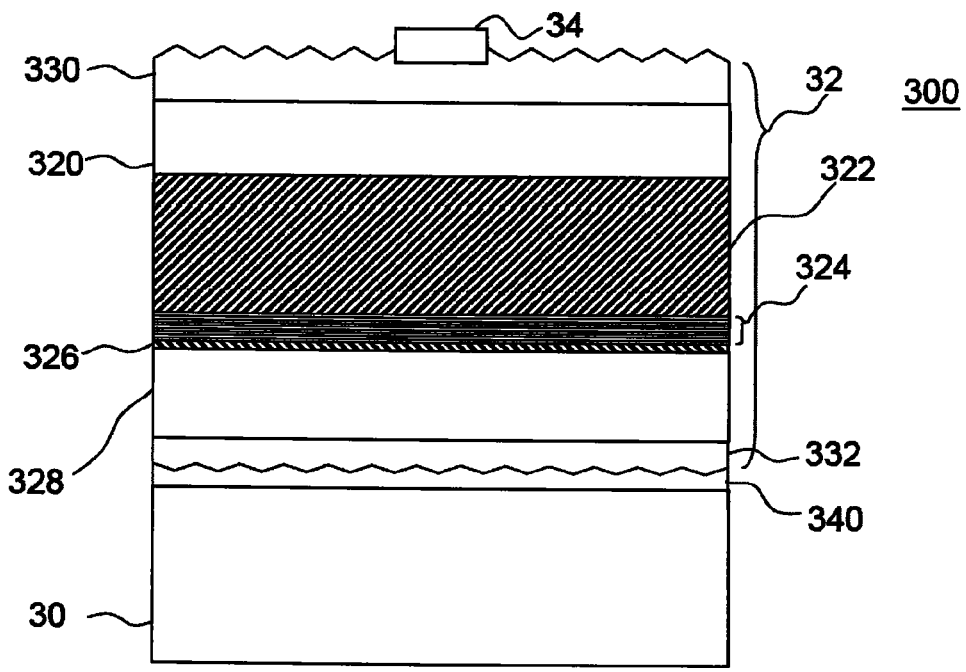
FIG. 6 is a schematic illustration of the structure of the light-emitting diode device in accordance with further another embodiment of the present application.

FIG. 6 is a schematic illustration of the structure in accordance with another embodiment of the present application. In the structure of the light emitting device 300, the epitaxial structure 32 can further include a first-type conductivity window layer 330 and a second-type conductivity window layer 332 formed on the first-type conductivity cladding layer 320 and below the second-type conductivity cladding layer 328 respectively. The light extraction surface of the first-type conductivity window layer 330 and the lower surface of the second-type conductivity window layer 332 can be a rough surface to reduce the total internal reflection (TIR) occurred by the changing of the material refractive index of the light extracted from the light-emitting layer 324 and to raise the light extraction efficiency.

Besides, an adhesion layer can be formed between the substrate 30 and the epitaxial structure 32 to fix the epitaxial structure 32 on the substrate 30, wherein the material of the adhesion layer comprises at least one material selected from the group consisting of polyimide (PI), Benzocyclobutene (BCB), and perfluorocyclobutane (PFCB); or metal material.

It should be noted that the proposed various embodiments are not for the purpose to limit the scope of the invention. Any possible modifications without departing from the spirit of the invention may be made and should be covered by the invention.

What is claimed is:

1. A light-emitting diode device comprising:
an epitaxial structure comprising a light-emitting layer generating light having an intensity distribution along the growth direction of the epitaxial structure, wherein the light-emitting layer comprises a multiple quantum well structure, and the max value of the intensity occurs in a portion of the epitaxial structure other than the light-emitting layer;
a first-type conductivity confining layer and a second-type conductivity confining layer formed on the upper surface and the lower surface of the light-emitting layer respectively; and a first-type conductivity cladding layer and a second-type conductivity cladding layer formed on the first-type conductivity confining layer and below the second-type conductivity confining layer respectively,
the thickness ratio of the first-type conductivity confining layer and the second-type conductivity confining layer is $\frac{1}{2} \sim \frac{1}{200}$ or 2-200, and
the light emitting diode emits an incoherent light.

2. The light-emitting diode device according to claim 1, wherein the intensity distribution curve has a peak zone having an intensity value higher than 90% of the maxima value of the intensity in the intensity distribution curve.

3. The light-emitting diode device according to claim 1, wherein the epitaxial structure comprises at least one element selected from the group consisting of Ga, Al, In, P, N, and any combination thereof.

4. The light-emitting diode device according to claim 1 further comprising a substrate formed below the epitaxial structure.

5. The light-emitting diode device according to claim 1, wherein the light-emitting layer has a first refraction index $n_1$, the first-type conductivity confining layer and the second-type conductivity confining layer have a second refractive index $n_2$, the first-type conductivity cladding layer and the second-type conductivity cladding layer have a third refractive index $n_3$, wherein the first refractive index is larger than the second refractive index, and the second refractive index is larger than the third refractive index ($n_1 > n_2 > n_3$).

6. The light-emitting diode device according to claim 1, further comprising a first-type conductivity window layer and a second-type conductivity window layer formed on the first-type conductivity cladding layer and below the second-type conductivity cladding layer respectively, wherein the light extraction surface of the first-type conductivity window layer and the lower surface of the second-type conductivity window layer are rough surface.

7. The light-emitting diode device according to claim 1, wherein the light-emitting layer has an optical confinement factor $\tau_{active\ layer}$ smaller than 60%.

8. A light-emitting diode device, comprising:
a light-emitting stack, comprising:
a light-emitting layer comprising a multiple quantum well structure;
a first-type conductivity confining layer formed on the light-emitting layer,
a second-type conductivity confining layer formed below the light-emitting layer; and
a substrate formed on the second-type conductivity confining layer, wherein the thickness of the first-type conductivity confining layer is not equal to that of the second-type conductivity confining layer,
the thickness ratio of the first-type conductivity confining layer and the second-type conductivity confining layer is smaller than $\frac{1}{100}$ or larger than 100, and
the light emitting diode emits an incoherent light.

9. The light-emitting diode device according to claim 8, further comprising a first-type conductivity window layer and a second-type conductivity window layer formed on a first-type conductivity cladding layer and below a second-type conductivity cladding layer respectively, and the first-type conductivity cladding layer and the second-type conductivity cladding layer formed on the first-type conductivity confining layer and below the second-type conductivity confining layer respectively.

10. The light-emitting diode device according to claim 9, wherein the light extraction surface of the first-type conductivity window layer and the lower surface of the second-type conductivity window layer are rough surface.

11. The light-emitting diode device according to claim 9, wherein the light-emitting layer having a first refraction index $n_1$, the first-type conductivity confining layer and the second-type conductivity confining layer have a second refractive index $n_2$, the first-type conductivity cladding layer and the second-type conductivity cladding layer have a third refractive index $n_3$, wherein the first refractive index is larger than the second refractive index, and the second refractive index is larger than the third refractive index ($n_1 > n_2 > n_3$).

12. The light-emitting diode device according to claim 8, wherein the light-emitting stack comprises at least one element selected from the group consisting of Ga, Al, In, P, N, and any combination thereof.

13. The light-emitting diode device according to claim 7, wherein the light-emitting layer has an optical confinement factor $\tau_{active\ layer}$ smaller than 60%.

14. A light-emitting diode device, comprising:
a substrate; and
a light-emitting stack on the substrate, comprising:
a light-emitting layer comprising a multiple quantum well structure;
a first-type conductivity confining layer formed on the light-emitting layer;
a second-type conductivity confining layer formed below the light-emitting layer;
a first-type conductivity cladding layer formed on the first-type conductivity confining layer; and
a second-type conductivity cladding layer formed below the second-type conductivity confining layer;
the thickness of the first-type conductivity confining layer is not equal to the second-type conductivity confining layer,
the light-emitting layer generates light having an intensity distribution along the growth direction of the epitaxial structure, and the max value of the intensity occurs in a portion of the epitaxial structure other than the light-emitting layer, and
the light emitting diode emits an incoherent light.

15. The light-emitting diode device according to claim 14, wherein the light-emitting layer having a first refraction index $n_1$, the first-type conductivity confining layer and the second-type conductivity confining layer have a second refractive index $n_2$, the first-type conductivity cladding layer and the second-type conductivity cladding layer have a third refractive index $n_3$, wherein the first refractive index is larger than the second refractive index, and the second refractive index is larger than the third refractive index ($n_1 > n_2 > n_3$).

* * * * *